(12) United States Patent
Mistry et al.

(10) Patent No.: US 8,044,494 B2
(45) Date of Patent: Oct. 25, 2011

(54) STACKABLE MOLDED PACKAGES AND METHODS OF MAKING THE SAME

(75) Inventors: Addi B. Mistry, Austin, TX (US); Marc A. Mangrum, Manchaca, TX (US); David T. Patten, Austin, TX (US); Jesse Phou, Austin, TX (US); Ziep Tran, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 24 days.

(21) Appl. No.: 12/567,469

(22) Filed: Sep. 25, 2009

(65) Prior Publication Data

US 2010/0013065 A1   Jan. 21, 2010

Related U.S. Application Data

(62) Division of application No. 11/968,873, filed on Jan. 3, 2008, now abandoned, which is a division of application No. 11/311,579, filed on Dec. 16, 2005, now abandoned.

(51) Int. Cl.
*H01L 23/552* (2006.01)
*H01L 23/02* (2006.01)

(52) U.S. Cl. ............... 257/659; 257/686; 257/E23.114

(58) Field of Classification Search ........... 257/659, 257/686, E23.114
See application file for complete search history.

(56) References Cited

U.S. PATENT DOCUMENTS

| | | | |
|---|---|---|---|
| 5,153,379 A | 10/1992 | Guzuk et al. | |
| 5,220,489 A | 6/1993 | Barreto et al. | |
| 5,222,014 A | 6/1993 | Liu | |
| 5,311,059 A | 5/1994 | Banerji et al. | |
| 5,405,808 A | 4/1995 | Rostoker et al. | |
| 5,650,659 A | 7/1997 | Mostafazadeh et al. | |
| 5,891,753 A | 4/1999 | Akram | |
| 6,007,317 A | 12/1999 | Mess | |
| 6,291,259 B1 | 9/2001 | Chun | |
| 6,707,168 B1 * | 3/2004 | Hoffman et al. | 257/796 |
| 6,815,254 B2 | 11/2004 | Mistry et al. | |
| 6,933,598 B2 * | 8/2005 | Karnezos | 257/686 |
| 7,537,962 B2 * | 5/2009 | Jang et al. | 438/109 |
| 7,642,133 B2 * | 1/2010 | Wu et al. | 438/109 |
| 7,851,894 B1 * | 12/2010 | Scanlan | 257/659 |
| 2004/0065473 A1 | 4/2004 | Chang et al. | |
| 2004/0207064 A1 | 10/2004 | Brooks et al. | |
| 2004/0212066 A1 | 10/2004 | Wang | |
| 2005/0093152 A1 | 5/2005 | Fjelstad et al. | |
| 2005/0164429 A1 | 7/2005 | Kinsman et al. | |

OTHER PUBLICATIONS

Restriction on Related U.S. Appl. No. 11/311,579 mailed Mar. 27, 2007.

(Continued)

*Primary Examiner* — Jenny L. Wagner
(74) *Attorney, Agent, or Firm* — Ranjeev Singh; Joanna G. Chiu

(57) ABSTRACT

A first packaged integrated circuit (IC) includes a package substrate, at least one IC die attached to a first surface of the package substrate, a plurality of conductive members on the first surface at least partially surrounding the at least one IC die and electrically connected to the at least one IC die, an encapsulant over the first surface surrounding the at least one IC die and the plurality of conductive members, wherein at least a portion of each of the plurality of conductive members is exposed by the encapsulant. A second packaged IC may be stacked onto the first packaged IC. The second packaged IC includes at least one IC die and a plurality of conductive members, each conductive member of the plurality of conductive members of the second packaged IC is in contact with a corresponding conductive member of the plurality conductive members of the first packaged IC.

17 Claims, 8 Drawing Sheets

OTHER PUBLICATIONS

Office Action on Related U.S. Appl. No. 11/311,579 mailed ~Apr. 27, 2007.
Office Action on Related U.S. Appl. No. 11/311,579 mailed ~Sep. 10, 2007.
Restriction on Related U.S. Appl. No. 11/968,873 mailed Dec. 28, 2008.
Restriction on Related U.S. Appl. No. 11/968,873 mailed Mar. 3, 2009.
Office Action on Related U.S. Appl. No. 11/968,873 mailed May 27, 2009.

* cited by examiner

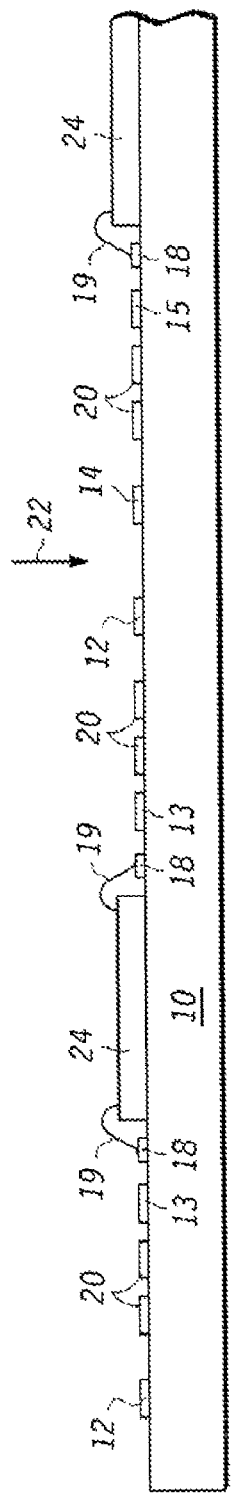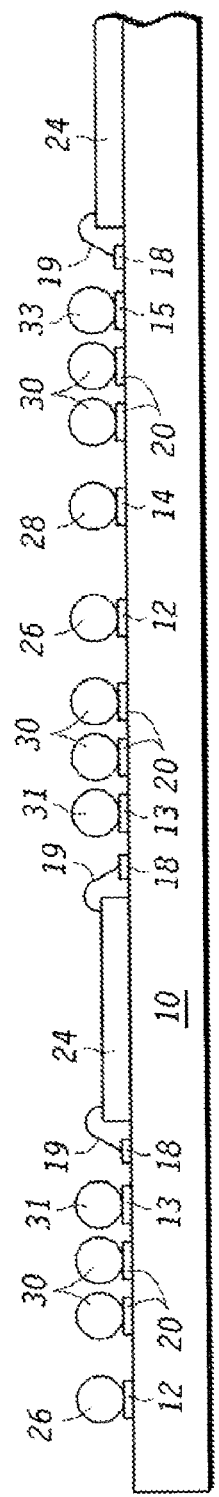

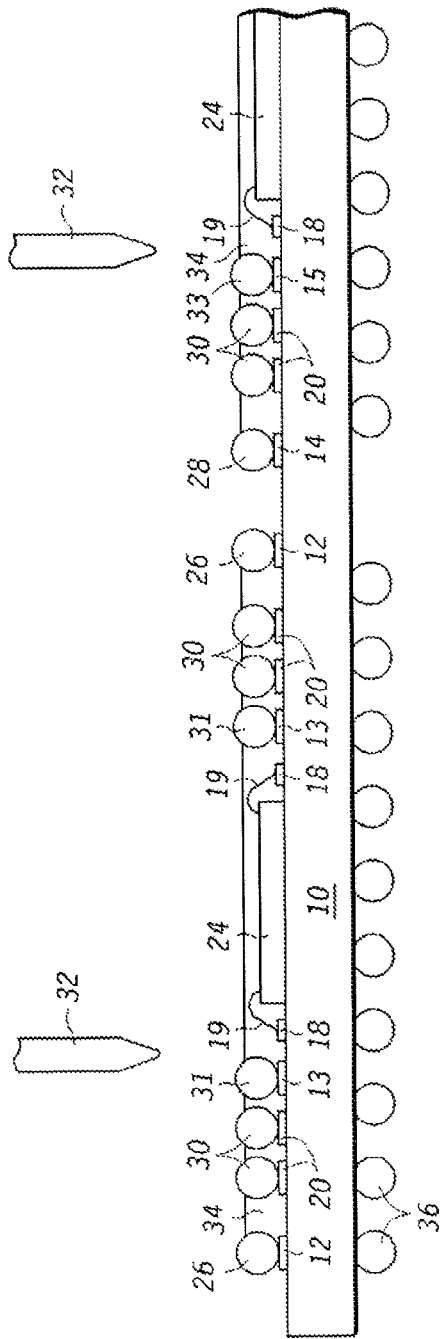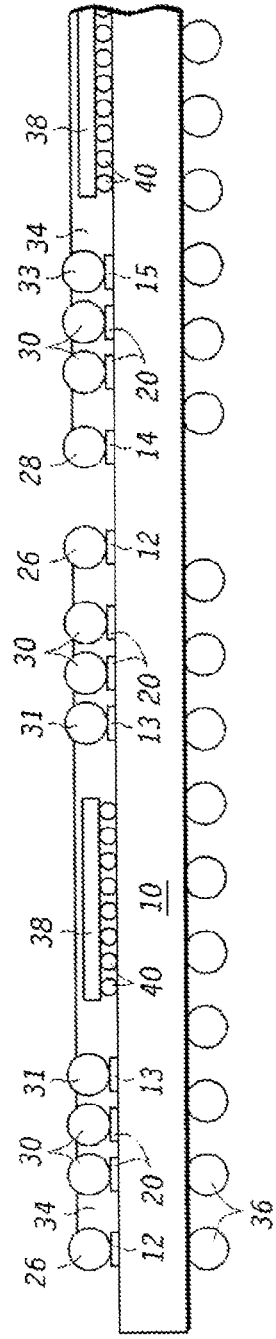
FIG. 4
FIG. 5

STACKABLE MOLDED PACKAGES AND METHODS OF MAKING THE SAME

This application is a division application of prior Application No. Ser. No. 11/968,873, filed on Mar. 1, 2008, which is a division application of prior Application No. Ser. No. 11/311,579, filed on Dec. 16, 2005, now abandoned.

FIELD OF THE INVENTION

The present invention relates generally to integrated circuit packages, and more particularly to stackable molded packages and methods of making the same.

RELATED ART

Traditional stackable packages often warp resulting in poor reliability of contacts with other packages. In general, such stackable packages include a substrate and a molded die on top of the substrate. Typically, the mold covering the die does not cover the entire surface of the substrate. In such a stackable package, the thin substrate, which is not supported by the mold in entirety, is more prone to suffer from warpage. This warpage may result from different thermal coefficients of expansion for the substrate and the mold. Stackable packages may be stacked in a package-on-package structure and may be interconnected using solder balls.

When conventional stackable packages are used in a package-on-package structure, however, warpage of the stackable package may result in poor contacts between stacked packages. Conventionally, this problem has been addressed by increasing the diameter and pitch of the solder balls interconnecting the stacked packages. Increased diameter and pitch of the solder balls, however, results in several problems. For example, use of larger solder balls reduces the area available for the die and the metal routing of the substrate. Furthermore, use of larger solder balls increases the height of the package-on-package structure.

Thus, there is a need for improved stackable molded packages and methods of making the same.

BRIEF DESCRIPTION OF THE DRAWINGS

The present invention is illustrated by way of example and not limited by the accompanying figures, in which like references indicate similar elements, and in which:

FIG. 2 is a cross section view of the exemplary substrate strip of FIG. 1 with wire-bonded dies, consistent with one embodiment of the invention;

FIG. 3 is a cross section view of the exemplary substrate strip of FIG. 2 with dams and conductive balls, consistent with one embodiment of the invention;

FIG. 4 is a cross section view of the exemplary substrate strip of FIG. 3 with the encapsulant dispensed between dams, consistent with one embodiment of the invention;

FIG. 5 is a cross section view of an exemplary substrate strip with a flip chip die, consistent with one embodiment of the invention;

Figure 1:
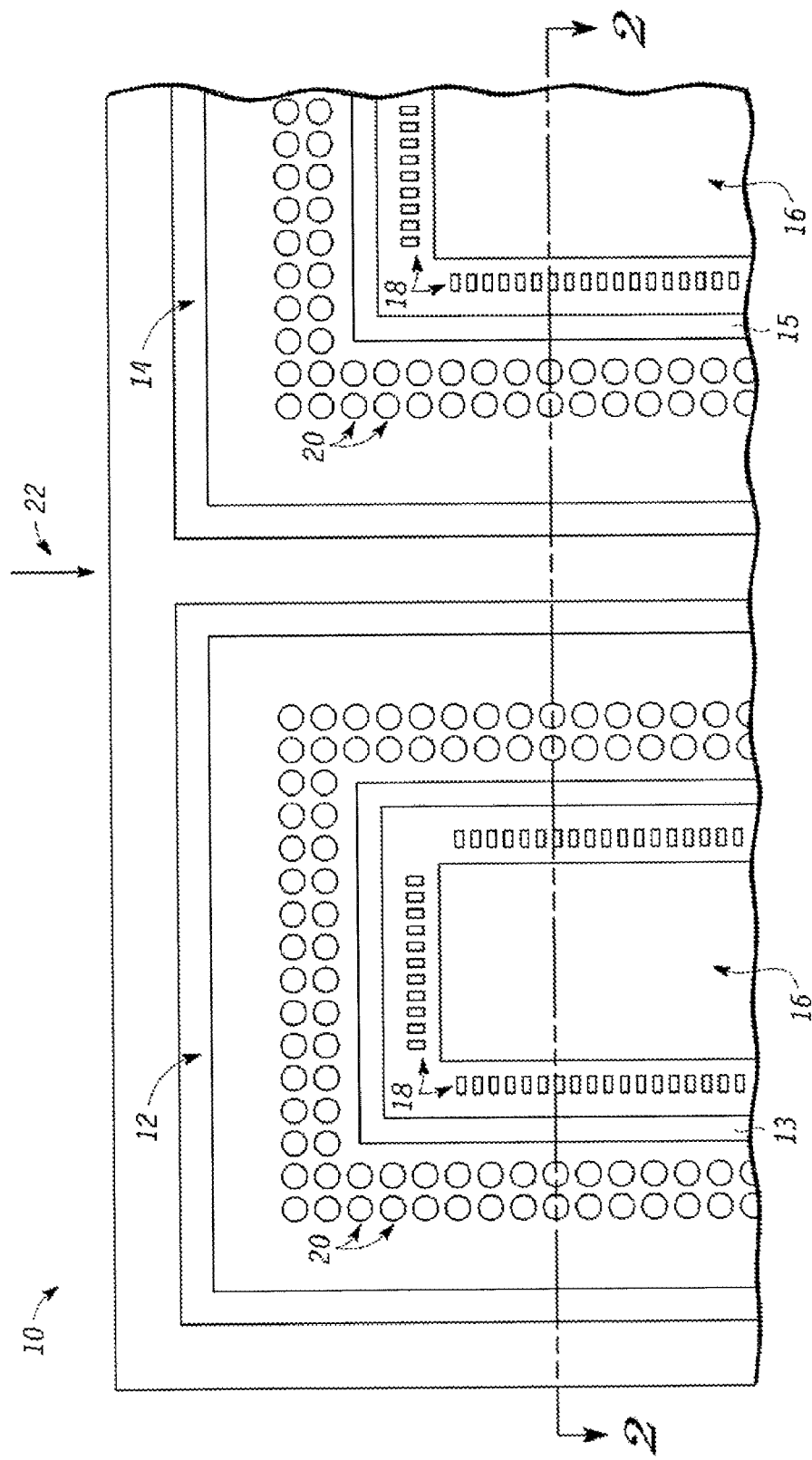
FIG. 1 is a top view of an exemplary substrate strip, consistent with one embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE EMBODIMENTS

In one aspect, an exemplary method for forming a stackable package, such as a packaged integrated circuit is provided. The exemplary method may include providing a package substrate having a first surface, a first IC die attached to the first surface, a plurality of conductive members on the first surface at least partially surrounding the first IC die and electrically connected to the first IC die, and a dam on the first surface at least partially surrounding the plurality of conductive members. The exemplary method may further include performing a surface fill by providing an encapsulant to the first surface of the package substrate wherein the encapsulant surrounds the first IC die and is at least partially contained by the dam and wherein portions of each of the plurality of conductive members remain exposed during the surface fill.

In another aspect, another exemplary method for forming a packaged integrated circuit is provided. The method may include providing a package substrate having a first surface, a first IC die attached to the first surface, a plurality of conductive members on the first surface at least partially surrounding the first IC die and electrically connected to the first IC die. The method may further include providing a protection plate in physical contact with a top portion of each of the plurality of conductive members. The method may further include providing an encapsulant onto the first surface of the package substrate, wherein the encapsulant surrounds the first IC die and each of the plurality of conductive members, and wherein the protection plate remains in physical contact with the top portion of each of the plurality of conductive members during the providing the encapsulant. The method may further include removing the protection plate, wherein after removing the protection plate, the top portion of each of the plurality of conductive members remains exposed.

In yet another aspect, a packaged integrated circuit is provided. The packaged integrated circuit may include a first packaged IC having a package substrate, at least one IC die attached to a first surface of the package substrate, a plurality of conductive members on the first surface at least partially surrounding the at least one IC die and electrically connected to the at least one IC die, an encapsulant over the first surface surrounding the at least one IC die and the plurality of conductive members, wherein at least a portion of each of the plurality of conductive members is exposed by the encapsulant. The packaged integrated circuit may further include a second packaged IC stacked onto the first packaged IC, the second packaged IC having at least one IC die and a plurality of conductive members electrically connected to the at least one IC die of the second packaged IC, each conductive member of the plurality of conductive members of the second packaged IC in contact with a corresponding conductive member of the plurality of conductive members of the first packaged IC.

FIG. 1 is a top view of an exemplary substrate strip, consistent with one embodiment of the invention. As part of the process of forming stackable packages a substrate strip 10 may be formed, which may include multiple substrate units. Substrate strip 10 may include die attach areas 16, to which die could be attached later. Substrate strip 10 may further include bond posts 18 for wire bonding die. FIG. 1 shows bond posts 18 for wire bonding die, die may be connected to substrate strip 10 using other techniques, such as flip chip bonding. Substrate strip 10 may further include contact pads 20 for connecting stackable packages. Although FIG. 1 shows two rows/columns of contact pads 20 additional or fewer rows/columns may also be used.

Substrate strip 10 may further include dam bars 12 and 14. Dam bars 12 and 14 may be used to stop the flow of an encapsulant material beyond the periphery of the stackable package. Dam bars 12 and 14 may be formed by depositing solder balls on a copper strip. Alternatively, dam bars 12 and 14 may be formed by depositing any suitable dam bar material, including conductive or non-conductive materials. Furthermore, additional bars, such as bars 13 and 15 may be formed by depositing suitable dam bar material. Bars 13 and 15 may serve as a radio frequency shield for a die attached to die attach areas 16. Additionally and/or alternatively, bars 13 and 15 may serve to shield the die from interference, such as electromagnetic interference. Also, shown in FIG. 1 is the direction 22 of saw-street along which substrate strip 10 may be singulated. Although FIG. 1 refers to a substrate strip 10 having a row of substrate of units, an array of substrate units with more than one row of substrate units may also be used. Referring now to FIG. 2, as part of the process of forming stackable packages, die 24 may be wire bonded to substrate strip 10 using bond posts 18 and wires 19.

FIG. 3 is a cross section view of the exemplary substrate of FIG. 2 with dams, shielding bars, and conductive balls, consistent with one embodiment of the invention. As part of this step, dams 26, shielding supports 31, and conductive balls 30 may be formed by re-flowing conductive material. Dams 26 (which may be formed using conductive balls), conductive balls 30, and shielding supports may be preformed and may be attached to respective contact areas.

FIG. 4 is a cross section view of the exemplary substrate of FIG. 3 with the encapsulant dispensed between dams, consistent with one embodiment of the invention. As shown, as the next step of forming stackable packages, an encapsulant 34 may be dispensed on the top surface of substrate strip 10 using dispensers 32, for example. Dams 26 may prevent the flow of encapsulant 34 beyond the periphery of the stackable packages. Any conventional encapsulants may be used as part of this step. External conductive balls 36 may be formed on a bottom surface of substrate strip 10. Alternatively, preformed external conductive balls 36 may be attached to the bottom surface of substrate strip 10. Referring to FIG. 5, flip chip die 38 may also be used as part of stackable packages. Encapsulant 34 may act as an underfill between flip chip die 38 and a top surface of substrate strip 10. As part of the final step, stackable packages may be singulated. Die may be attached to substrate strip 10 using processes other than wire bonding and flip chip bonding.

Figure 6:
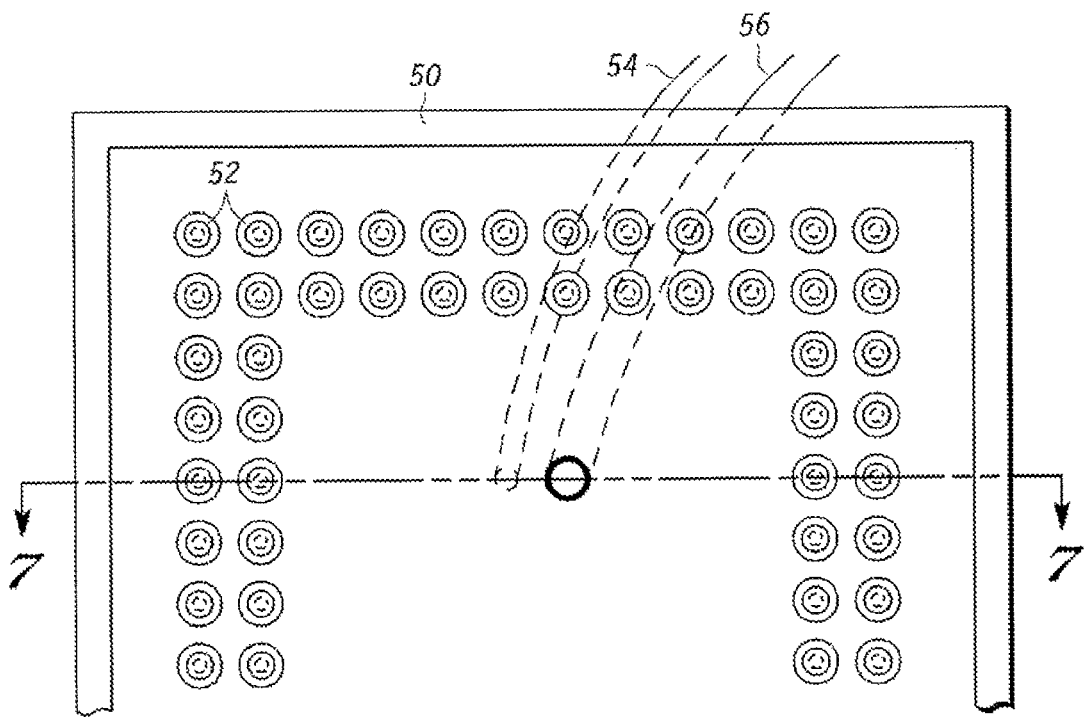
FIG. 6 is a top view of an exemplary top mold chase with vacuum-assisted pad protectors, consistent with one embodiment of the invention.
Figure 7:
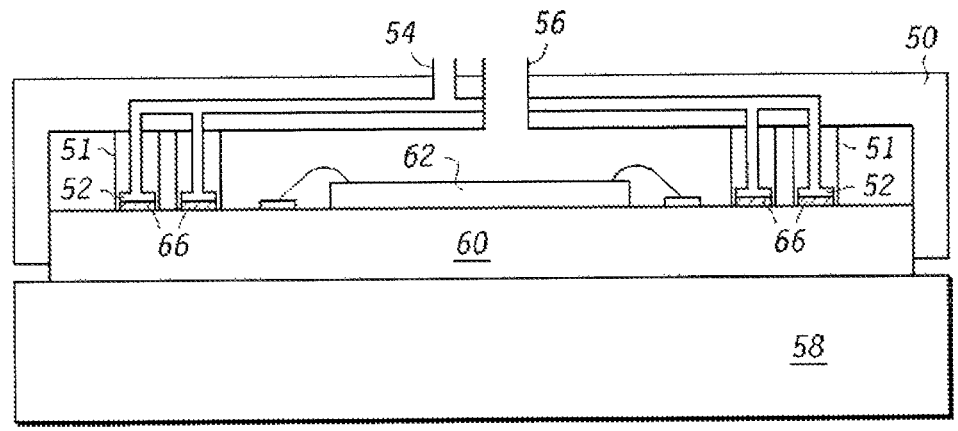
FIG. 7 is a cross section view of a substrate inside a mold chase, consistent with one embodiment of the invention.
Figure 8:
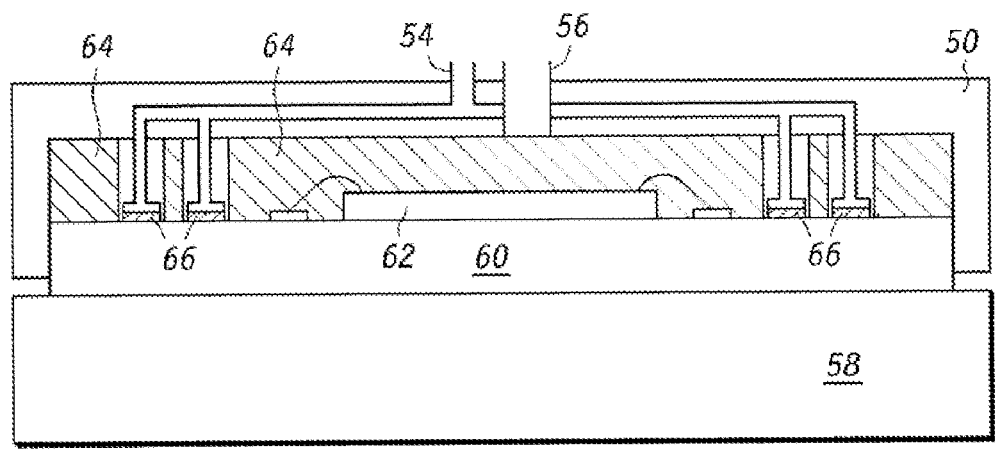
FIG. 8 is a cross section view of a substrate with mold injected on top of the substrate, consistent with one embodiment of the invention.

Consistent with another embodiment of the invention, stackable packages may also be formed using a molding process. FIG. 6 is a top view of an exemplary top mold chase with vacuum-assisted pad protectors, consistent with one embodiment of the invention, which may be used as part of the molding process. Top mold chase 50 may include vacuum-assisted pad protectors 52 located in vacuum housing 51. Vacuum housing 51 may be of the same material as the material of top mold chase 50. In addition, although not shown in FIG. 7, inserts could be added to vacuum-assisted pad protectors 52 or to vacuum housing 51 in order to, for example, narrow the area covered by vacuum-assisted pad protectors 52 resulting in a variable pad width. Top mold chase 50 may further include a vacuum tube 54. Using vacuum tube 54, the interface between vacuum-assisted pad protectors 52 and contact pads 66 may be made substantially air-tight and thus preventing flow of any molding material into an area above contact pads 66. Top mold chase 50 may further include a mold injecting tube 56. Molding material may be injected using mold injecting tube 56. Referring to FIG. 7 now, a cross section view of a substrate inside a mold chase is shown. Substrate 60, including a die 62 attached to it, may be held between top mold chase 50 and bottom mold chase 58. Molding material 64 (shown in FIG. 8) may be injected using mold injecting tube 56. Vacuum tube 54 may be used to prevent the molding material from flowing into an area above contact pads 66. By way of another example, instead of applying vacuum through vacuum-assisted pad protectors 52, a positive pressure may be applied through vacuum-assisted pad protectors 52 to prevent the molding material from flowing into an area above contact pads 66. The application of positive pressure and/or vacuum could be controlled during the molding process to prevent overflow on the contact pads 66. Referring further to FIG. 8, molding material 64 is shown as filling the area between top mold chase 50 and substrate 60, except the area occupied by die 62 and the area protected by vacuum-assisted pad protectors 52.

Figure 9:
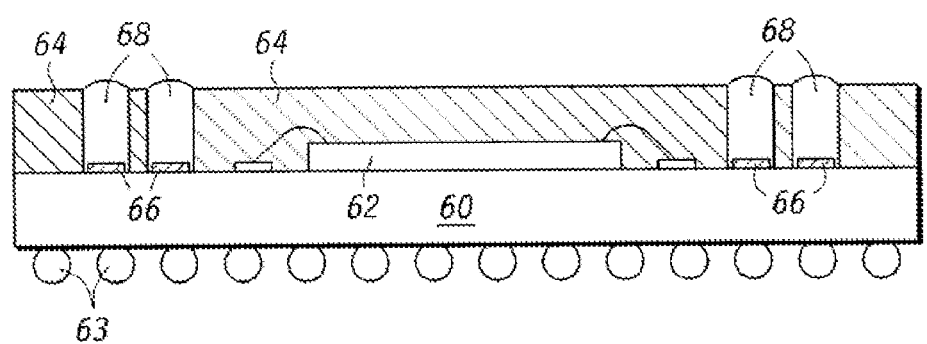
FIG. 9 is a cross section view of an exemplary stackable package, consistent with one embodiment of the invention.

FIG. 9 is a cross section view of an exemplary stackable package, consistent with one embodiment of the invention. Stackable package may include die 62 attached to substrate 60 with molding material 64 on top. Stackable package may further include conductive material 68 filled into the area protected by vacuum-assisted pad protectors 52. Conductive material 68 may be filled using conventional processes and then leveled using a solder squeegee, for example. Conductive material 68 may be reflowed and the stackable package grinded, if necessary. Solder balls may also be inserted in the area above contact pads 66, which could then be reflowed to form conductive material 68. Additionally, external conductive balls 63 may be formed on a bottom surface of substrate 60 for connecting the stackable package to other packages or other components, such as printed circuit boards. Although FIG. 9 shows die 62 as being wire bonded to substrate 60, die 62 may be attached to substrate 60 using other techniques, such as flip chip bonding. Further, stackable packages may be formed using other exemplary mold processes, as well. For example, as described below, a mold chase with a conductive ball protection plate may also be used to form stackable packages.

Figure 10:
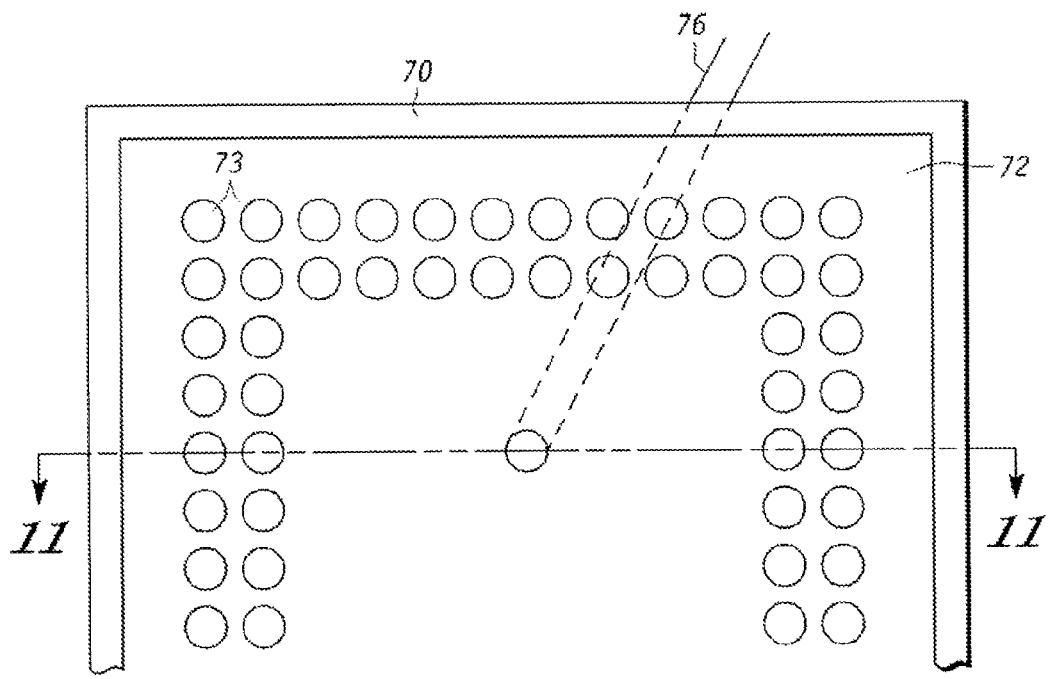
FIG. 10 is a top view of an exemplary top mold chase with a conductive ball protection plate, consistent with one embodiment of the invention.
Figure 11:
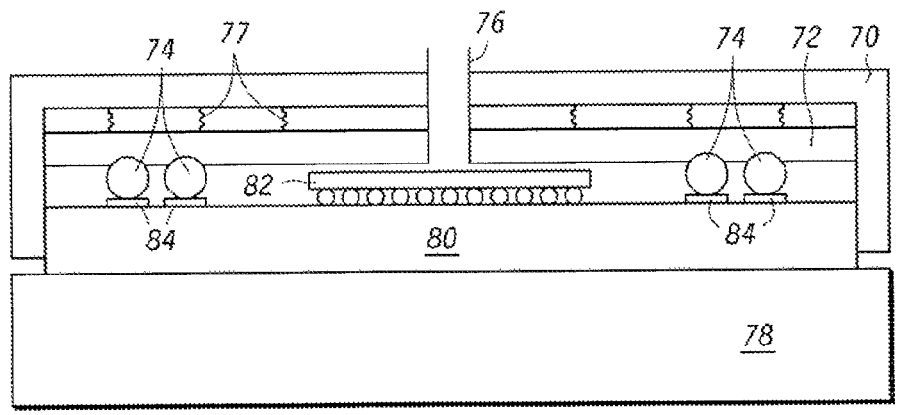
FIG. 11 is a cross section view of a substrate inside a mold chase, consistent with one embodiment of the invention.
Figure 12:
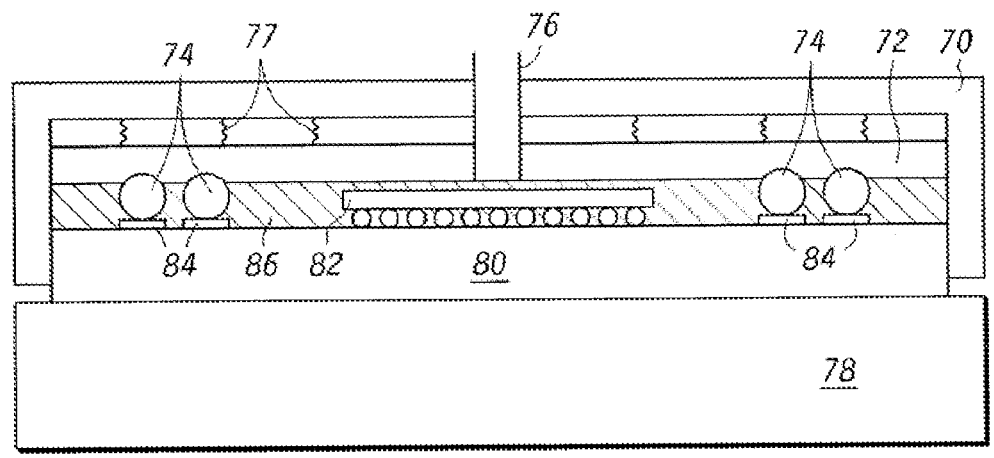
FIG. 12 is a cross section view of a substrate with mold injected on top of the substrate, consistent with one embodiment of the invention.

As shown in FIG. 10, a top mold chase 70 may include a conductive ball protection plate 72. Top mold chase 70 may further include a mold injection tube 76. Referring now to FIG. 11, a cross section view of a substrate 80 inside a mold chase is shown. Substrate 80, including a die 82 attached to it, may be held between top mold chase 70 and bottom mold chase 78. Molding material 86 (shown in FIG. 12) may be injected using mold injecting tube 76. Alignment indentations 73 formed in conductive ball protection plate 72 may cover the top portion of conductive balls 74 to prevent the flow of molding material 86 on top of conductive balls 74. Thus, after conductive ball protection plate 72 is removed subsequent to the injection of molding material, a top portion of conductive balls 74 may remain exposed. By way of example, conductive ball protection plate 72 may be connected to top molding plate 70 using springs 77. Springs 77 may provide pressure to conductive ball protection plate 72 to ensure that conductive ball protection plate 72 is not pushed up by molding material 86. Referring further to FIG. 12, molding material 86 is shown as filling the area between conductive ball protection plate 72 and substrate 80, except the area occupied by die 82. Molding material 86 is also shown as an underfill for die 82.

Figure 13:
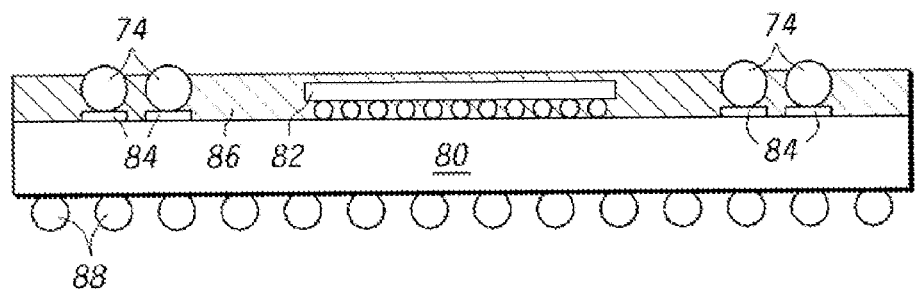
FIG. 13 is a cross section view of another exemplary stackable package, consistent with one embodiment of the invention.

FIG. 13 is a cross section view of an exemplary stackable package, consistent with one embodiment of the invention. Stackable package may include die 82 attached to substrate 80 with molding material 86 on top. Stackable package may further include conductive balls 74, whose top portion is not covered by molding material 86 and is thus exposed. Additionally, external conductive balls 88 may be formed on a bottom surface of substrate 80 for connecting the stackable package to other packages or other components, such as printed circuit boards. Although FIG. 13 shows die 82 as being flip chip bonded to substrate 80, die 82 may be attached to substrate 80 using other techniques, such as wire bonding.

Figure 14:
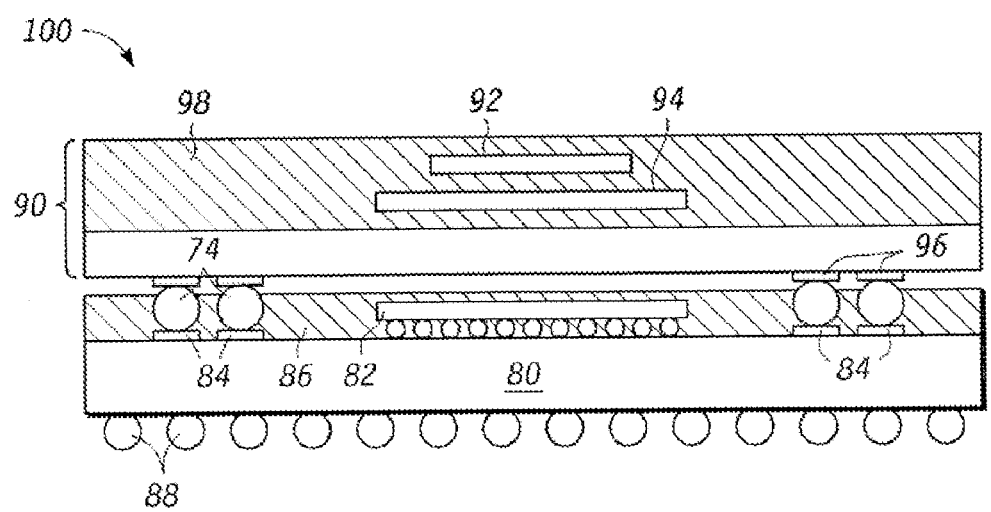
FIG. 14 is a cross section view of an exemplary package-on-package structure, consistent with one embodiment of the invention.

FIG. 14 is a cross section view of an exemplary package-on-package structure 100, consistent with one embodiment of the invention. In general, a package-on-package (POP) structure 100 may be formed by stacking multiple packages. By way of example, POP structure 100 may include a top package 90 over another stackable package. Package 90 may include die 92 and die 94 encapsulated in an encapsulant 98. Package 90 may further include connecting pads 96 for connecting package 90 to another package. Thus, as shown in FIG. 14, conductive balls 74 may be connected to connecting pads 96 to connect package 90 to another stackable package. Any stackable package described above may be used as part of POP structure 100. Although FIG. 14 shows a non-stackable package stacked on top of a stackable package, a stackable package may also be stacked on top of the stackable package. Furthermore, any number of packages and/or stackable packages may be stacked on top of each other. Each package and/or stackable package may include one or more die. External conductive balls 88 may be formed on a bottom or top surface of any package, as and when necessary.

Figure 15:
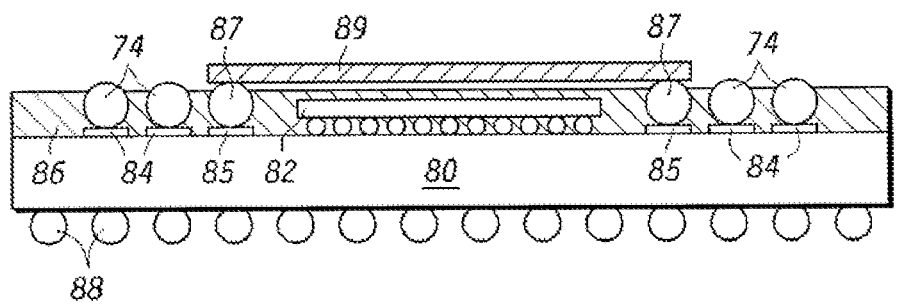
FIG. 15 is a cross section view of an exemplary stackable package with a shield, consistent with one embodiment of the invention.

FIG. 15 is a cross section view of another exemplary stackable package, consistent with one embodiment of the invention. Stackable package may include die 82 attached to substrate 80 with molding material 86 on top. Stackable package may further include conductive balls 74, whose top portion is not covered by molding material 86 and is thus exposed. Additionally, external conductive balls 88 may be formed on a bottom surface of substrate 80 for connecting the stackable package to other packages or other components, such as printed circuit boards. Although FIG. 15 shows die 82 as being flip chip bonded to substrate 80, die 82 may be attached to substrate 80 using other techniques, such as wire bonding. Stackable package may further include contact pads 85 with shielding support, such as contact balls 87 connected to contact pads 85. Additionally, a shield, such as a radio frequency shield or an electromagnetic interference shield may be mounted on top of shielding support/contact balls 87. Although FIG. 15 shows contact balls 87 as shielding support, other types of shielding support may also be used.

Figure 16:
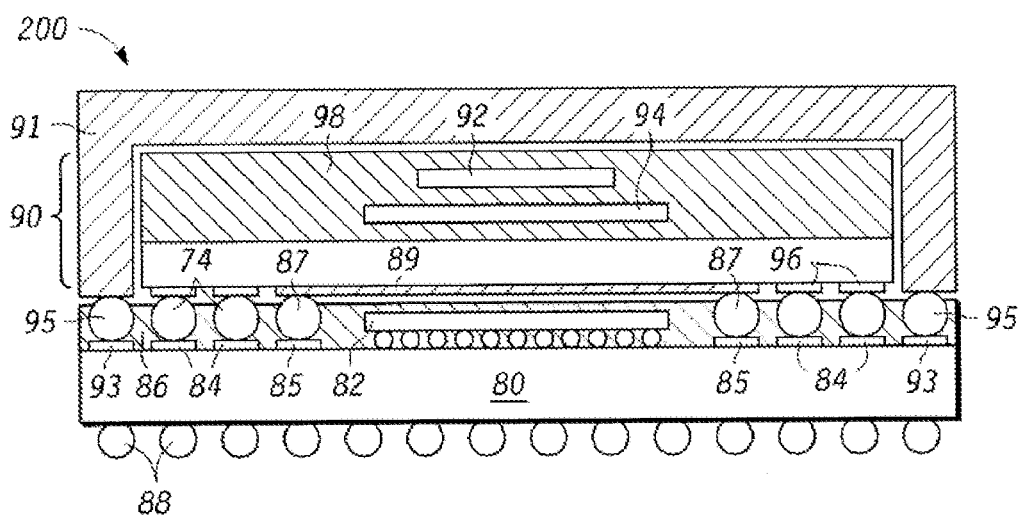
FIG. 16 is a cross section view of another exemplary package-on-package structure, consistent with one embodiment of the invention.

FIG. 16 is a cross section view of another exemplary package-on-package structure 200, consistent with one embodiment of the invention. In general, a package-on-package (POP) structure 200 may be formed by stacking multiple packages. By way of example, POP structure 200 may include a top package 90 over another stackable package. Package 90 may include die 92 and die 94 encapsulated in an encapsulant 98. Package 90 may further include connecting pads 96 for connecting package 90 to another package. Thus, as shown in FIG. 16, conductive balls 74 may be connected to connecting pads 96 to connect package 90 to another stackable package. Any stackable package described above may be used as part of POP structure 200. Although FIG. 16 shows a non-stackable package stacked on top of a stackable package, a stackable package may also be stacked on top of the stackable package. Furthermore, any number of packages and/or stackable packages may be stacked on top of each other. Each package and/or stackable package may include one or more die. External conductive balls 88 may be formed on a bottom or top surface of any package, as and when necessary. In addition, package-on-package structure 200 may include a shield 91, which may act as a radio frequency shield or an electromagnetic interference shield. By way of example, contact pads 93 on a top surface of bottom package may be formed, which may then have a shielding support, such as contact balls 95 mounted thereon. Shield 91 may then be attached to contact balls 95. Although FIG. 16 shows contact balls 95 as shielding support, other types of shielding support may also be used. Contact balls 87 and 95, acting as shielding support, may be electrically connected through the substrate to balls 88 which can be grounded to the desired locations.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A packaged integrated circuit (IC) system comprising:
   a first packaged IC having a package substrate, at least one IC die attached to a first surface of the package substrate, a plurality of conductive members on the first surface at least partially surrounding the at least one IC die and electrically connected to the at least one IC die, an encapsulant over the first surface surrounding the at least one IC die and the plurality of conductive members, wherein at least a portion of each of the plurality of conductive members is exposed; and a second packaged IC stacked onto the first packaged IC, the second packaged IC having at least one IC die and a first plurality of conductive members electrically connected to the at least one IC die of the second packaged IC, each conductive member of the first plurality of conductive members of the second packaged IC in contact with a corresponding conductive member of the plurality of conductive members of the first packaged IC; and at least one of a first radio frequency shield and a first electromagnetic interference shield arranged above the first packaged IC and at least one of a second radio frequency shield and a second electromagnetic shield arranged above the second packaged IC.

2. The packaged IC system of claim 1, wherein the second packaged IC further comprises a second plurality of conductive members and wherein the at least one of the first radio frequency shield and the first electromagnetic shield is electrically connected to the second plurality of the conductive members.

3. The packaged IC system of claim 2, wherein the second packaged IC further comprises a third plurality of conductive members and wherein the at least one of the second radio frequency shield and the second electromagnetic shield is electrically connected to the third plurality of the conductive members.

4. The packaged IC system of claim 1, wherein the at least one IC die is a flip chip die.

5. The packaged IC system of claim 1, wherein the second packaged IC comprises at least two IC die.

6. The packaged IC system of claim 1, wherein the first packaged IC further comprises a plurality of conductive balls for attaching the first packaged IC to at least one other component selected from a group consisting of a third packaged IC and a printed circuit board.

7. A packaged integrated circuit (IC) system comprising:
a first packaged IC having a package substrate, a plurality of conductive members on a first surface, at least one IC die electrically connected to the plurality of conductive members, and an encapsulant over the first surface surrounding the at least one IC die and the plurality of conductive members, wherein at least a portion of each of the plurality of conductive members is exposed;

a second packaged IC stacked onto the first packaged IC, the second packaged IC having at least one IC die and a first plurality of conductive members of the second packaged IC in contact with a corresponding conductive member on the plurality of conductive members of the first packaged IC; and at least one of a first radio frequency shield and a first electromagnetic interference shield arranged above the first packaged IC and at least one of a second radio frequency shield and a second electromagnetic shield arranged above the second packaged IC.

8. The packaged IC system of claim 7, wherein the first packaged IC further comprises a second plurality of conductive members and wherein the at least one of the first radio frequency shield and the first electromagnetic shield is electrically connected to the second plurality of the conductive members.

9. The packaged IC system of claim 8, wherein the first packaged IC further comprises a third plurality of conductive members and wherein the at least one of the second of the radio frequency shield and the electromagnetic shield is electrically connected to the third plurality of the conductive members.

10. The packaged IC system of claim 7, wherein the at least one IC die is a flip chip die.

11. The packaged IC system of claim 7, wherein the second packaged IC comprises at least two IC die.

12. the packaged IC system of claim 7, wherein the first packaged IC further comprises a plurality of conductive balls for attaching the first packaged IC to at least one other component selected from a group consisting of a third packaged IC and a printed circuit board.

13. A packaged integrated circuit (IC) system comprising:
a first packaged IC having a package substrate, a plurality of conductive members on the first surface, at least one IC die electrically connected to the plurality of conductive members, and an encapsulant over the first surface surrounding the at least one IC die and the plurality of conductive members, wherein at least a portion of each of the plurality of conductive members is exposed, wherein the first packaged IC further includes a plurality of conductive balls on a second surface of the first packaged IC, wherein the second surface is an opposite side of the first surface; and a second packaged IC stacked onto the first packaged IC, the second packaged IC having at least one IC die and a first plurality of conductive members electrically connected to the at least one IC die of the second packaged IC, each conductive member of the first plurality of conductive members of the second packaged IC in contact with a corresponding conductive member of the plurality of conductive members of the first packaged IC; and at least one of a first radio frequency shield and a first electromagnetic interference shield arranged above the first packaged IC and at least a second radio frequency shield and a second electromagnetic shield arranged above the second packaged IC.

14. The packaged IC system of claim 13, wherein the second packaged IC further comprises a second plurality of conductive members and wherein the at least one of the first radio frequency shield and the first electromagnetic shield is mounted using the second plurality of the conductive members.

15. The packaged IC system of claim 14, wherein the second packaged IC further comprises a third plurality of conductive members and wherein the at least one of the second of the radio frequency shield and the electromagnetic shield is mounted using the second plurality of the conductive members.

16. The packaged IC system of claim 13, wherein the at least one IC die is a flip chip die.

17. The packaged IC system of claim 13, wherein the second packaged IC comprises at least two IC die.

* * * * *